United States Patent [19]

Wurzburg

[11] 4,455,539

[45] Jun. 19, 1984

[54] SWITCHED CAPACITOR ALL PASS FILTER

[75] Inventor: Henry Wurzburg, Round Rock, Tex.

[73] Assignee: Motorola, Inc., Schaumburg, Ill.

[21] Appl. No.: 407,684

[22] Filed: Aug. 13, 1982

[51] Int. Cl.³ .................... H03H 19/00; H03H 11/12
[52] U.S. Cl. ................................... 333/173; 328/151;
333/28 R; 333/165
[58] Field of Search ............... 333/165, 166, 167, 172,
333/173, 28 R; 307/246, 520–521; 328/151

[56] References Cited

U.S. PATENT DOCUMENTS 4,315,227 2/1982 Fleischer et al. ................... 333/173
4,370,632 1/1983 Allgood et al. ..................... 333/173

OTHER PUBLICATIONS

Martin et al.–"Strays-Insensive Switched-Capacitor Filters Based on Bilinear Z-Transform", Electronics Letters, Jun. 21, 1979, vol. 15, No. 13; pp. 365–366.

Primary Examiner—Marvin L. Nussbaum
Attorney, Agent, or Firm—Anthony J. Sarli, Jr.; Jeffrey Van Myers; Robert L. King

[57] ABSTRACT

A switched capacitor all pass filter which provides an output signal having substantially linear magnitude and phase response is provided. A transfer function which represents an all pass filter and which has a predetermined phase response is provided. A filter/phase equalizer structure having integrating operational amplifiers and various feedback portions which represent the transfer function is also provided.

10 Claims, 2 Drawing Figures

SWITCHED CAPACITOR ALL PASS FILTER

TECHNICAL FIELD

This invention relates generally to all pass filters, and, more particularly, to a switched capacitor all pass filter.

BACKGROUND ART

Two primary characteristics of a filter with respect to frequency response are magnitude response and phase response. The magnitude response of a filter describes how the gain of the filter changes with respect to frequency and the phase response of a filter describes how the phase of the signal changes between the input and output with respect to frequency. In most applications, magnitude response is the most important characteristic of a filter and phase response is not a primary consideration. However, in data communication with keyed carriers, such as in FSK modem transmission, linear phase response is essential to prevent the commonly known bias distortion phenomenom. Previously, others have used an all pass passive LCR or active RC phase equalizer network to linearize the phase response of a filter network. However, such circuits generally require inductors and/or capacitors external to a monolithic integrated circuit. The virtues of using switched capacitor technology as applied to bandpass filters are described in "Exact Design of Switched-Capacitor Bandpass Filters Using Coupled-Biquad Structures" by Martin and Sedra in the IEEE *Transactions on Circuits and Systems*, Volume CAS-27, No. 6, June 1980, pages 469–474.

BRIEF SUMMARY OF THE INVENTION

Accordingly, it is an object of the present invention to provide a switched capacitor all pass filter having a predetermined phase response.

Another object of the invention is to provide an improved all pass filter.

Yet another object of the present invention is to provide an improved all pass structure for use as a phase equalizer with a filter.

In carrying out the above and other objects of the present invention, there is provided, in one form, an all pass filter structure in switched capacitor form which has a predetermined phase response for a range of frequencies. A transfer function representing an all pass filter which has a predetermined phase response is desired. A filter/phase equalizer structure having integrating operational amplifiers and various feedback means is provided. The Z-plane transfer function of the filter/phase equalizer structure is derived and found to be equal to the desired transfer function which provides phase equalization in the form of an all pass filter.

The above and other objects, features and advantages of the present invention will be more clearly understood from the following detailed description taken in conjunction with the accompanying drawings.

DESCRIPTION OF THE PREFERRED EMBODIMENT

Figure 1:
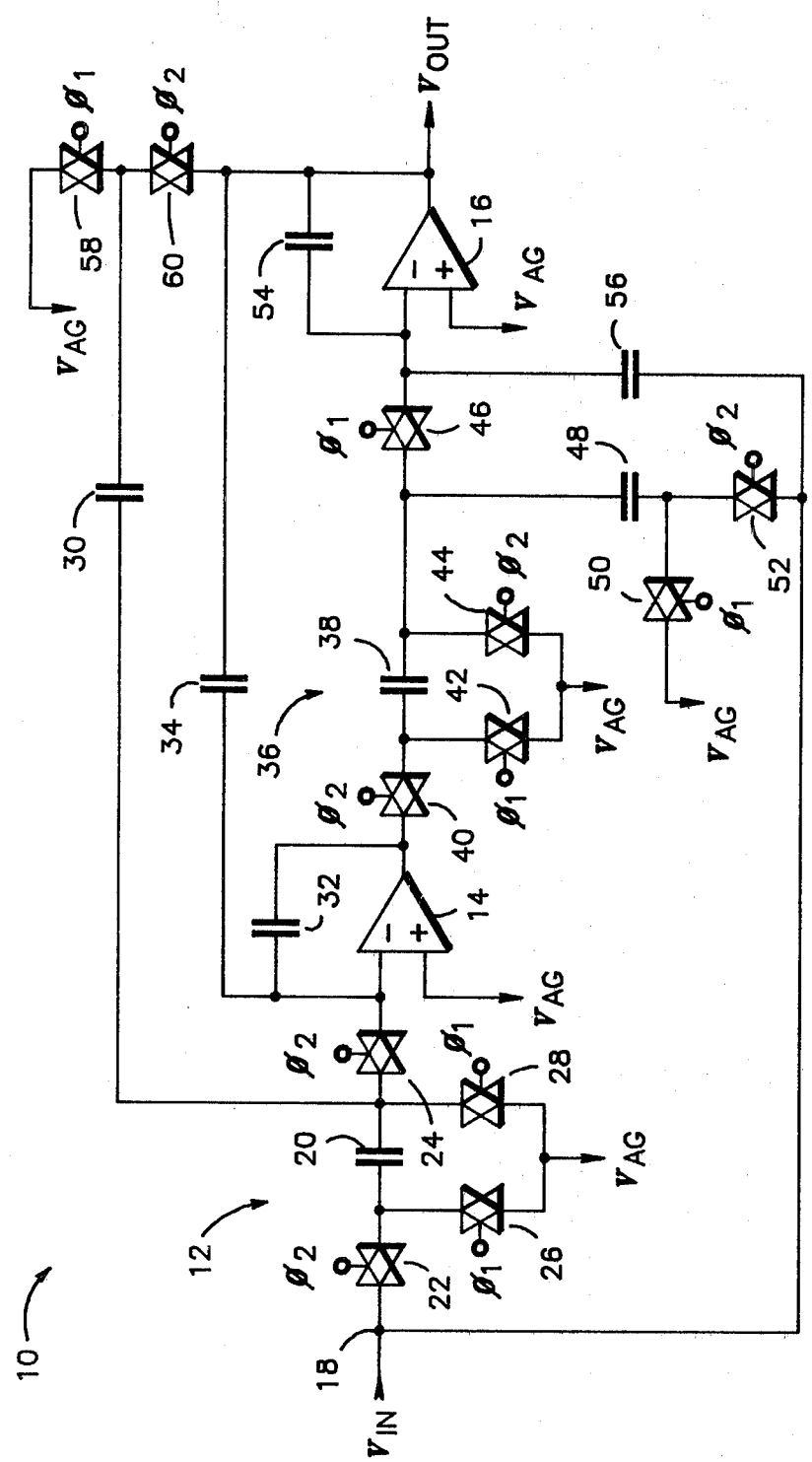
FIG. 1 illustrates in schematic form a switched capacitor all pass filter in accordance with a preferred embodiment of the present invention.

In any N-ordered filter, various frequency responses are obtainable depending upon the location of poles and zeroes. In most applications, maximum magnitude response is a very important characteristic because sinusoidal components are being filtered out of a signal to obtain a desired signal. To obtain the maximum magnitude response, the passband should be made as flat as possible and the smallest transition ratio between passband to stopband should be obtained. If this is obtained, a nonlinear phase response will result. Therefore, filters often have a nonlinear phase response with respect to a variation in frequency.

The delay of the spectral components of an input signal as it passes through a filter is determined by the negative of the slope of the phase versus frequency characteristic. This delay is commonly known as group delay. When the slope of the phase versus frequency characteristic slope is linear, a constant group delay results. With a nonlinear slope, there is a changing group delay for various frequency components. Even though a low pass filter may eliminate the proper high frequencies, the shape of the resulting filtered signal in the time domain is distorted if group delay is changing. For example, if two signals in a passband filter are 1 KHz and 2 KHz, respectively, when the signals are outputted on a spectrum analyzer the 1 KHz and 2 KHz components will have the same size if there is a flat passband and uniform gain. However, the shape of the output waveform with respect to time will vary drastically depending upon the phase of the 1 KHz and 2 KHz signals. Although the spectral components of the 1 KHz and 2 KHz signals may be the same, the output time waveform will be very different from the input time waveform because the time waveform depends on both phase and amplitude response.

In data communications with keyed carriers such as in FSK modem transmission, there is a high frequency carrier and a low frequency carrier. When the carriers are inputted into a low pass filter, they are smoothed out into sine waves. Although a uniform amplitude exists, a linear phase response may not. Therefore, the transition point between signals will be distorted resulting in bias distortion. In any system requiring the maintenance of the temporal characteristics of both the waveform being put into the filter and the output waveform, and the removal of only the higher frequency components, a filter that delays the two waveforms an equal amount of time is desired. It usually does not matter what the slope of the phase curve is. All that is important is that the slope of the phase curve is linear.

If the input waveform comprised only two sinusoids, it would only be important that the group delay of those two sinusoids be equal. This is a simplification because during modulating and changing between frequency components, sidebands result. To accomplish a transition between frequency, more spectral components must be added. Through a frequency range, the group delay must be kept constant. A measure of this is the differential group delay over a frequency range of interest. The difference in group delay between one frequency range and another is required to be no greater than a predetermined amount in order to guarantee acceptable phase linearity over the frequency ranges. Therefore, when the signal is processed through the filter, an output signal having the same transition boundaries as the input signal results.

In data communications, a carrier signal is typically FSK modulated with steps and the modulation rate is near the carrier rate. At RF frequency, changes occur so slowly with respect to the carrier frequency that the demodulation means are not period detectors but rather slope detectors. In modem applications, period measurements and phase locked loops are used where the rate of signal frequency change is very close to the rate of change of the carrier. Therefore the waveform must not be distorted to get accurate measurements of it. This is where linear phase filters are needed.

The problem that a designer typically encountered in the design of an nth order filter is that although good phase characteristics can be obtained, such a filter will have a very poor rolloff and very low rejection. In other words, a filter having good phase response but poor amplitude response normally results.

A solution to the problem where both linear magnitude and phase response are needed is to build an nth order filter having good amplitude response and poor phase response and follow it with an all pass filter or phase equalizer. The all pass filter has flat amplitude response. More importantly however, a known and predetermined phase response exists which adds enough excess phase over the frequency domain to the phase response of the nth order filter to make the overall phase response appear more linear. This decreases the differential group delay. The more nonlinear the phase is and the wider the frequency region, the higher the order of the phase equalizer that is required.

An equation which represents a general continuous-time second-order transfer function for an allpass filter in the S plane is:

$$H(S) = -(S^2 - a_1 S + a_0)/(S^2 + a_1 S + a_0).$$

The bilinear Z transform of this transfer function can be applied by substituting $(Z-1)/(Z+1)$ for S. It can be readily shown that the resulting Z transform is:

$$H(Z) = -\frac{m(1 - A_1 + A_0)Z^2 + 2m(A_0 - 1)Z + m(1 + A_1 + A_0)}{Z^2 + 2m(A_0 - 1)Z + m(1 + A_0 - A_1)} \quad (1)$$

where $m = 1/(1 + A_1 + A_0)$ and $A_0$ and $A_1$ are constants which are positive and real numbers. Therefore, a switched capacitor all pass filter which has substantially linear phase response must have this transfer function.

Shown in FIG. 1 is an all pass filter 10 constructed in accordance with a preferred embodiment of the present invention. Filter 10 is a biquad circuit which comprises an integrating operational amplifier 14 and an integrating operational amplifier 16. An input means 12 is coupled between an input terminal 18 and an inverting or negative input of operational amplifier 14. An input voltage $V_{IN}$ which is to be filtered is coupled to input terminal 18. Input means 12 comprise a switched capacitor 20 and switches 22, 24, 26, and 28. A first terminal of switch 22 is coupled to input terminal 18, and a second terminal of switch 22 is coupled to both a first electrode of capacitor 20 and a first terminal of switch 26. A second electrode of capacitor 20 is coupled to a first terminal of switch 28, to a first terminal of switch 24 and to a first electrode of a feedback capacitor 30. Switches 26 and 28 both have a second terminal coupled to a reference or supply voltage terminal, illustrated as analog ground $V_{AG}$. The inverting input of operational amplifier 14 is coupled to a second terminal of switch 24, to a first electrode of a feedback capacitor 32 and to a first electrode of a feedback capacitor 34. A noninverting or positive input of operational amplifier 14 is coupled to reference voltage $V_{AG}$. A second terminal of capacitor 32 is coupled to an output of operational amplifier 14 and to a switched capacitor means 36. Switched capacitor means 36 comprise a capacitor 38 and switches 40, 42, 44 and 46. A first terminal of switch 40 is coupled to both the output of operational amplifier 14 and the second terminal of capacitor 32. A second terminal of switch 40 is coupled to a first electrode of capacitor 38 and to a first terminal of switch 42. A second electrode of capacitor 38 is coupled to a first terminal of switch 44, to a first terminal of switch 46, and to a first electrode of a feedback capacitor 48. Switches 42 and 44 both have a second electrode coupled to reference voltage $V_{AG}$. A second electrode of capacitor 48 is coupled to a first terminal of a switch 50 and to a first terminal of a switch 52. A second terminal of switch 50 is coupled to reference voltage $V_{AG}$. A second terminal of switch 46 is coupled to an inverting or negative input of operational amplifier 16, to a first electrode of a feedback capacitor 54, and to a first electrode of a feedback capacitor 56. A second electrode of feedback capacitor 56 is coupled to a second terminal of switch 52 and to input terminal 18. A noninverting or positive input of operational amplifier 16 is coupled to reference voltage $V_{AG}$. A second terminal of feedback capacitor 30 is coupled to a first terminal of a switch 58 and to a first terminal of a switch 60. A second terminal of switch 60 is coupled to a second electrode of capacitor 34, to a second electrode of capacitor 54, and to an output of operational amplifier 16 which provides an output voltage $V_{OUT}$. A second terminal of switch 58 is coupled to reference voltage $V_{AG}$. In the preferred embodiment, all switches shown and described are CMOS transmission gates which are clocked in a conventional manner. Switches 26, 28, 42, 46, 50 and 58 are clocked by a control signal ∅1 shown in FIG. 2 and switches 22, 24, 40, 44, 52 and 60 are clocked by a control signal ∅2 also shown in FIG. 2. All switches are constructed to be conductive when the control signal applied thereto is at a high logic state and nonconductive otherwise. Control signals ∅1 and ∅2 are nonoverlapping and may be complementary signals although not so illustrated in FIG. 2.

For purposes of illustration only, all capacitors shown in FIG. 1 have been given predetermined values.
Capacitor 20 has a predetermined value of $K_1 C_1$ and capacitor 30 has a predetermined value of $K_4 C_1$.
Capacitor 32 has a predetermined value of $C_1$ and capacitor 34 has a predetermined value of $K_6 C_1$.
Capacitor 38 has a predetermined value of $K_5 C_2$ and capacitor 48 has a predetermined value of $K_5 K_2 C_2$.
Capacitor 54 has a predetermined value of $C_2$ and capacitor 56 has a predetermined value of $K_3 C_2$.

Figure 2:
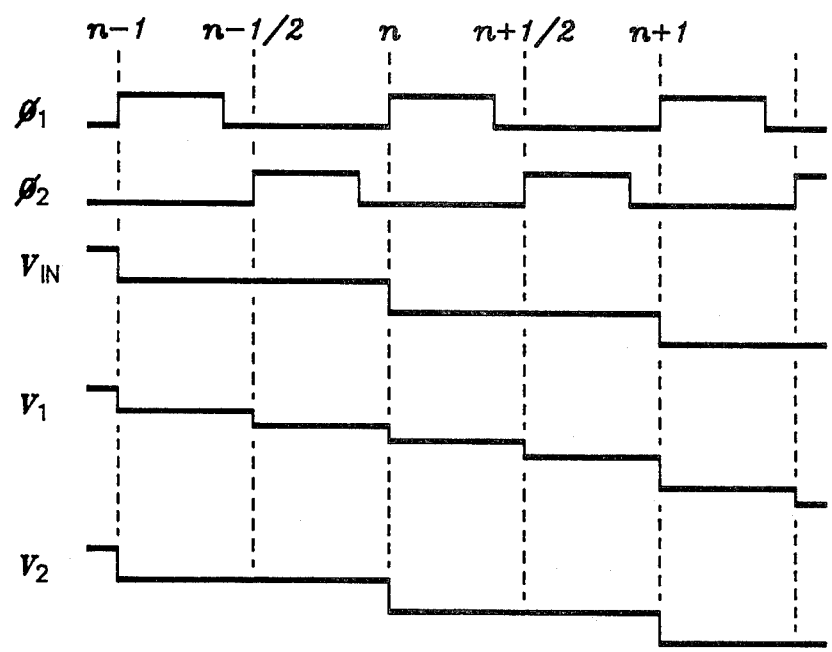
FIG. 2 illustrates in graphical form waveforms associated with the filter shown in FIG. 1.

Shown in FIG. 2 is a graphical representation of an input signal $V_{IN}$ which is a step voltage having a period of n. An output voltage $V_1$ of operational amplifier 14 and an output voltage $V_2$ of operational amplifier 16 which are provided in response to $V_{IN}$ are also shown. Voltage $V_2$ is also equal to filter 10 output voltage $V_{OUT}$. The transfer function of filter 10 can be found by writing difference equations at time interval multiples of n and n+½ for the charge transfer as follows:

$$V_2(n+1) - V_2(n) = K_5 V_1(n+\tfrac{1}{2}) + K_5 K_2 V_{IN}(n) - K_3 \cdot [V_{IN}(n+1) - V_{IN}(n)]$$

and $$V_1(n+\tfrac{1}{2}) - V_1(n-\tfrac{1}{2}) = -K_1 V_{IN}(n) - K_4 V_2(n) - K_6[V_2(n) - V_2(n-1)]$$

Applying the Z transform to the above, it can be readily shown that $$H(Z) = \frac{V_2}{V_{IN}} = -\frac{K_3 Z^2 + (-2K_3 - K_5 K_2 + K_1 K_5)Z + (K_3 + K_2 K_5)}{Z^2 + (-2 + K_4 K_5 + K_5 K_6)Z + (1 - K_5 K_6)} \quad (2)$$

If the transfer function of equation (2) is the same transfer function as equation (1), the circuit of FIG. 1 realizes the stated objects of the present invention. It can be readily shown that:

$K_4 K_5 = 4mA_0$
$K_5 K_6 = 2mA_1$
$K_3 = m(1 - A_1 + A_0)$
$K_2 K_5 = 2mA_1$
and
$K_1 K_5 = 4mA_0$.

$K_1$, $K_2$, $K_3$, $K_4$, $K_5$, and $K_6$ are constants which are positive and real numbers. Since $A_0$ and $A_1$ are positive, all constants in equation (2) are positive and realizable.

By now it should be appreciated that an all pass filter/phase equalizer implementable in switched capacitor form has been provided. An all pass amplitude and predetermined phase response is provided thereby minimizing group delay.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A switched capacitor all pass filter comprising:
    an input means coupled to an input terminal adapted to receive an analog voltage to be filtered, said input means comprising a first switched capacitor means;
    a first integrating operational amplifier having a first input terminal adapted to receive a reference voltage source, a second input terminal coupled to said input means, and an output terminal;
    a first feedback means comprising a first capacitor having a first electrode coupled to the second input terminal of said first integrating operational amplifier, and a second electrode coupled to the output terminal of said first integrating operational amplifier;
    a second switched capacitor means having an input terminal coupled to the output terminal of said first integrating operational amplifier, and an output terminal;
    a second integrating operational amplifier having a first input terminal adapted to receive said reference voltage source, a second input terminal coupled to the output terminal of said second switched capacitor means, and an output terminal for providing a filtered output signal;
    a second feedback means comprising a second capacitor having a first electrode coupled to the inverting input terminal of said second integrating operational amplifier, and a second electrode coupled to the output terminal of said second integrating operational amplifier;
    a third feedback means comprising a third capacitor having a first electrode coupled to the inverting input of said first integrating operational amplifier, and a second electrode coupled to the output of said second integrating operational amplifier;
    a fourth feedback means comprising a fourth capacitor having a first electrode coupled to said first switched capacitor means, and a second electrode alternately coupled between said reference voltage source and the output terminal of said second integrating operational amplifier;
    a fifth feedback means comprising a fifth capacitor having a first electrode coupled to said second switched capacitor means, and a second electrode alternately coupled between said reference voltage source and said input terminal;
    a sixth feedback means comprising a sixth capacitor having a first electrode coupled to said input terminal, and a second electrode coupled to the inverting input terminal of said second integrating operational amplifier;
    wherein the voltage from said input terminal is converted to a sampled data signal and an output voltage which contains all frequency components of the input voltage and which has a predetermined phase response for all frequencies is provided.

2. The switched capacitor all pass filter of claim 1 wherein said first and second switched capacitor means each comprise a capacitor having a first and a second plate, two switching devices driven by a first clock signal for coupling the first and second plates to said reference voltage source, and two additional switching devices driven by a second clock signal.

3. The switched capacitor all pass filter of claim 2 wherein said first and second clock signals are nonoverlapping complementary signals.

4. The switched capacitor all pass filter of claim 1 wherein the transfer function for the filter circuit is:

$$H(Z) = -\frac{K_3 Z^2 + (-2K_3 - K_2 K_5 + K_1 K_5)z + (K_3 + K_2 K_5)}{Z^2 + (-2 + K_4 K_5 + K_5 K_6)Z + (1 - K_5 K_6)}$$

where $K_1$, $K_2$, $K_3$, $K_4$, $K_5$ and $K_6$ are predetermined constants.

5. A switched capacitor all pass filter having a substantially linear phase response and the following transfer function:

$$H(Z) = \frac{K_3 Z^2 + (-2K_3 - K_2 K_5 + K_1 K_5)z + (K_3 + K_2 K_5)}{Z^2 + (-2 + K_4 K_5 + K_5 K_6)Z + (1 - K_5 K_6)}$$

where $K_1$, $K_2$, $K_3$, $K_4$, $K_5$ and $K_6$ are predetermined constants, comprising:
    input means coupled to an input terminal adapted to receive an analog voltage to be filtered;

a first integrating operational amplifier having a first input adapted to receive a reference voltage source, a second input coupled to said input means, and an output;

first coupling means having a first terminal coupled to the output of the first integrating operational amplifier, and a second terminal;

a second integrating operational amplifier having a first input adapted to receive the reference voltage source, a second input coupled to the second terminal of the first coupling means, and an output;

second coupling means having a first terminal coupled to the output of the second integrating operational amplifier, and a second terminal coupled to the second input of the first integrating operational amplifier; and third coupling means having a first capacitor coupled between the second input of the second integrating operational amplifier and the input terminal, and a second capacitor having a first electrode selectively alternately coupled to the input terminal and the reference voltage source in response to first and second control signals, respectively, and a second electrode selectively coupled to the second input of the second integrating operational amplifier in response to the second control signal.

6. The switched capacitor all pass filter of claim 5 wherein said input means comprise:

a third capacitor having first and second electrodes;

a first switch having a first terminal coupled to the input terminal, a second terminal coupled to the first electrode of the third capacitor, and a control electrode coupled to a first control signal;

a second switch having a first terminal coupled to the first electrode of the third capacitor, a second terminal coupled to the reference voltage source, and a control terminal coupled to a second control signal;

a third switch having a first terminal coupled to the second electrode of the third capacitor, a second terminal coupled to the reference voltage source, and a control terminal coupled to the second control signal; and a fourth switch having a first terminal coupled to the second electrode of the third capacitor, a second terminal coupled to the second input of the first integrating operational amplifier, and a control terminal coupled to the first control signal.

7. The switched capacitor filter of claim 5 wherein the first integrating operational amplifier comprises:

an operational amplifier having an inverting input coupled to the input means, a noninverting input coupled to reference voltage source, and an output; and a third capacitor having a first electrode coupled to the inverting input of the operational amplifier, and a second electrode coupled to the output of the operational amplifier.

8. The switched capacitor filter of claim 5 wherein the first coupling means comprise:

a third capacitor having first and second electrodes;

a first switch having a first terminal coupled to the output of the first integrating operational amplifier, a second terminal coupled to the first electrode of the third capacitor, and a control terminal coupled to the first control signal;

a second switch having a first terminal coupled to the first electrode of the capacitor, a second terminal coupled to the reference voltage source, and a control terminal coupled to the second control signal;

a third switch having a first terminal coupled to the second electrode of the third capacitor, a second terminal coupled to the reference voltage source, and a control terminal coupled to the first control signal; and a fourth switch having a first terminal coupled to the second input of the second integrating operational amplifier, a second terminal coupled to the second electrode of the third capacitor, and a control terminal coupled to the second control signal.

9. The switched capacitor all pass filter of claim 5 wherein the second integrating operational amplifier comprises:

an operational amplifier having an inverting input coupled to the second terminal of the first coupling means, a noninverting input coupled to the reference voltage source, and an output; and a third capacitor having a first electrode coupled to the inverting input of the operational amplifier, and a second electrode coupled to the output of the operational amplifier.

10. The switched capacitor all pass filter of claim 6 wherein the second coupling means comprise:

a fourth capacitor having a first electrode coupled to the output of the second integrating operational amplifier, and a second electrode coupled to the second input of the first integrating operational amplifier;

a fifth switch having a first terminal coupled to the output of the second integrating operational amplifier, a second terminal, and a control terminal coupled to the first control signal;

a sixth switch having a first terminal coupled to the second terminal of the fifth switch, a second terminal coupled to the reference voltage source, and a control terminal coupled to the second control signal; and a fifth capacitor having a first electrode coupled to the second terminal of the fifth switch, and a second electrode coupled to the first terminal of the fourth switch.

* * * * *